(12) United States Patent
Mikasa

(10) Patent No.: US 7,683,437 B2
(45) Date of Patent: Mar. 23, 2010

(54) SEMICONDUCTOR DEVICE HAVING FIN FIELD EFFECT TRANSISTOR AND MANUFACTURING METHOD THEREOF

(75) Inventor: Noriaki Mikasa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 159 days.

(21) Appl. No.: 11/896,050

(22) Filed: Aug. 29, 2007

(65) Prior Publication Data

US 2008/0054374 A1 Mar. 6, 2008

(30) Foreign Application Priority Data

Aug. 30, 2006 (JP) ............... 2006-233499

(51) Int. Cl.
*H01L 27/088* (2006.01)
*H01L 29/06* (2006.01)
(52) U.S. Cl. ............... 257/401; 257/E29.024
(58) Field of Classification Search ........... 257/401, 257/E29.022, E29.024, E29.025, E29.027, 257/E29.026
See application file for complete search history.

(56) References Cited

U.S. PATENT DOCUMENTS

| 6,664,582 | B2 * | 12/2003 | Fried et al. | 257/308 |
| 6,794,718 | B2 | 9/2004 | Nowak et al. | |
| 6,927,458 | B2 * | 8/2005 | Worley | 257/361 |
| 2004/0099885 | A1 * | 5/2004 | Yeo et al. | 257/208 |
| 2004/0150029 | A1 * | 8/2004 | Lee | 257/308 |
| 2006/0063334 | A1 | 3/2006 | Donze et al. | |
| 2007/0045735 | A1 * | 3/2007 | Orlowski et al. | 257/347 |

FOREIGN PATENT DOCUMENTS

| JP | 5-136400 | 6/1993 |
| JP | 6-37279 | 2/1994 |
| JP | 7-122743 | 5/1995 |
| JP | 2001-298194 | 10/2001 |
| JP | 2002-118255 A | 4/2002 |
| JP | 2004-281845 | 10/2004 |
| JP | 2006-86530 | 3/2006 |
| JP | 2006-100600 | 4/2006 |
| JP | 2006-511962 A | 4/2006 |
| WO | WO 2004/061972 A1 | 7/2004 |

OTHER PUBLICATIONS

Japanese Office Action dated Nov. 25, 2008 with Partial English-Language Translation.

* cited by examiner

*Primary Examiner*—David Vu
*Assistant Examiner*—Earl N Taylor
(74) *Attorney, Agent, or Firm*—McGinn IP Law Group, PLLC

(57) ABSTRACT

A semiconductor device including fin-FETs capable of suppressing both OFF-current resulting from the short channel effect and junction leakage, and a manufacturing method thereof are provided. A semiconductor device comprises: an active region defined to have a crank shape by an STI region formed on a semiconductor substrate, the active region having an upper surface higher than an upper surface of the STI region; a source region and a drain region formed on both ends of the active region, respectively; a channel region formed between the source region and the drain region in the active region; and a gate electrode covering an upper surface and side surfaces of a central portion of the active region including the channel region.

12 Claims, 14 Drawing Sheets

SEMICONDUCTOR DEVICE HAVING FIN FIELD EFFECT TRANSISTOR AND MANUFACTURING METHOD THEREOF

TECHNICAL FIELD

The present invention relates to a semiconductor device and a semiconductor device manufacturing method, and, more particularly to a semiconductor device including fin field effect transistors and a manufacturing method thereof.

BACKGROUND OF THE INVENTION

In recent years, following downsizing of a memory cell in a DRAM (Dynamic Random Access Memory), a gate length of a memory cell transistor is inevitably reduced. However, if the gate length is smaller, then the short channel effect of the transistor disadvantageously becomes more conspicuous, and sub-threshold current is disadvantageously increased. Furthermore, if substrate concentration is increased to suppress the short channel effect and the increase of the sub-threshold current, junction leakage increases. Due to this, the DRAM is confronted with a serious problem of deterioration in refresh characteristics.

As a technique for avoiding the above-stated problem, attention is paid to a fin field effect transistor (hereinafter, "fin-FET") structured so that channel regions are formed to be thin each in the form of a fin in a perpendicular direction to a semiconductor substrate and so that gate electrodes are arranged around the channel regions (see Japanese Patent Application Laid-open No. 2006-100600). The fin-FET is expected to be able to realize acceleration of operating rate, increase in ON-current, reduction in power consumption and the like, as compared with a planer transistor.

A structure of a conventional fin-FET will be described below with reference to FIGS. 14A and 14B.

FIG. 14A is a general perspective view showing the structure of the conventional fin-FET, and FIG. 14B is a general cross-sectional view taken along a line A-A of FIG. 14A.

As shown in FIG. 14A, a trench 201*t* for STI (Shallow Trench Isolation) (hereinafter, "STI trench 201*t*") is formed in a semiconductor substrate 200 and an element isolation film 201I is buried in the STI trench 201*t* by a predetermined depth from a bottom of the STI trench 201*t*. A part of the semiconductor substrate 200 surrounded by the STI trench 201*t* and located above the element isolation insulating film 201I becomes a fin-shaped active region 202. The active region 202 includes a central portion 202*a* and portions 202*b* and 202*c* located on both sides of the central portion 202*a*, respectively. A gate electrode 203 is formed to cover an upper surface and both side surfaces of the fin-shaped active region 202 in the central portion 202*a* of the fin-shaped active region 202.

By performing ion implantation into the active region 202 of the semiconductor substrate 200 with the gate electrode 203 used as a mask, a source region 202*s* and a drain region 202*d* are formed in the active region 202 and a channel region 202*n* is formed between the source region 202*s* and the drain region 202*d* as shown in FIG. 14B.

In the fin-FET structured as shown in FIGS. 14A and 14B, it is preferable to form the source region 202*s* and the drain region 202*d* to be deep so that three surfaces, i.e., an upper surface and two side surfaces of the central portion 202*a* of the active region 202 function as channels. Due to this, the ion implantation needs to be performed with high energy to form the source and drain regions 202*s* and 202*d*.

However, if the ion implantation is performed with high energy so as to form the source and drain regions 202*s* and 202*d*, the source and drain regions 202*s* and 202*d* are diffused into the channel region 202*n* covered with the gate electrode 203 as shown in FIG. 14B. In such a fin-FET, if a gate length is smaller, a distance between the source and drain regions 202*s* and 202*d* shown as two-headed arrow in FIG. 14B is narrower, with the result that the short channel effect cannot be ignored.

To suppress OFF-current (Ioff) resulting from the short channel effect, a concentration of the channel region 202*n* may be increased. However, in a device, e.g., a DRAM memory cell, in which it is necessary to suppress junction leakage, if the concentration of the channel region is increased, junction electric field is deteriorated. The deterioration in junction electric field disadvantageously increases the junction leakage, resulting in deterioration in data holding characteristics.

SUMMARY OF THE INVENTION

It is, therefore, an object of the present invention to provide a semiconductor device including fin-FETs capable of suppressing both OFF-current resulting from the short channel effect and junction leakage, and a manufacturing method thereof.

According to the present invention, there is provided a semiconductor device comprising: an active region defined to have a crank shape by an STI region formed on a semiconductor substrate, the active region having an upper surface higher than an upper surface of the STI region; a source region and a drain region formed on both ends of the active region, respectively; a channel region formed between the source region and the drain region in the active region; and a gate electrode covering an upper surface and side surfaces of a central portion of the active region including the channel region.

According to the present invention, there is provided a semiconductor device comprising: a fin-shaped active region formed by a part of a semiconductor substrate; and a gate electrode extending in an X direction to cross the active region, and covering an upper surface and side surfaces of an almost central portion of the active region, wherein the active region has a channel region covered by the gate electrode and a source region and a drain region formed on both ends of the active region, respectively, wherein the source region and the drain region are offset each other in the X direction.

According to the present invention, there is provided a semiconductor device comprising: a fin-shaped active region; a gate electrode covering a first portion of the active region; and a source region and a drain region provided on a second portion and a third portion opposed to each other across the first portion of the active region, respectively, wherein the first portion includes at least one bent portion.

According to the present invention, the at least one bent portion includes a first bent portion and a second bent portion, and a region between the first bent portion and the second bent portion in the active region extends in a direction substantially identical to an extension direction of the gate electrode.

According to the present invention, there is provided a semiconductor device comprising: a fin-shaped active region including a first portion extending in a first direction, a second portion connected to one end of the first portion and extending in a second direction, and a third portion connected to other end of the first portion and extending in the second direction; a gate electrode extending in the first direction and covering the first portion, a part of the second portion, and a part of the third portion; a source region provided on another part of the second portion; and a drain region provided on another part of the third portion.

According to the present invention, there is provided a method of manufacturing a semiconductor device comprising: a step of forming a mask layer on a semiconductor substrate, the mask layer having a crank shape in a plan view; a step of etching the semiconductor substrate using the mask layer having the crank shape to form a trench in the semiconductor substrate; a step of burying an element isolation insulating film halfway in the trench to form a fin-shaped active region protruding from an upper surface of the element isolation insulating film, the fin-shaped active region having the crank shape in the plane view, a step of removing the mask layer; a step of forming a gate electrode extending in a direction perpendicular to a major axis direction of the fin-shaped active region, and covering an upper surface and side surfaces of an almost central portion of the active region; and a step of performing ion implantation with the gate electrode used as a mask to form a source region and a drain region on both ends of the fin-shaped active region, respectively.

According to the present invention, by using the fin-shaped active region, it is expected to realize an improvement in operating rate, an improvement in ON-current, a reduction in power consumption, and the like. Furthermore, a channel region is arranged between a source region and a drain region and the source region and the drain region are not in alignment. Due to this, even if the source region and the drain region are diffused into a region under a gate electrode by performing ion implantation for forming the source region and the drain region with high energy, the short channel effect can be suppressed without increasing a concentration of the channel region.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below with reference to the accompanying drawings.

Figure 1:
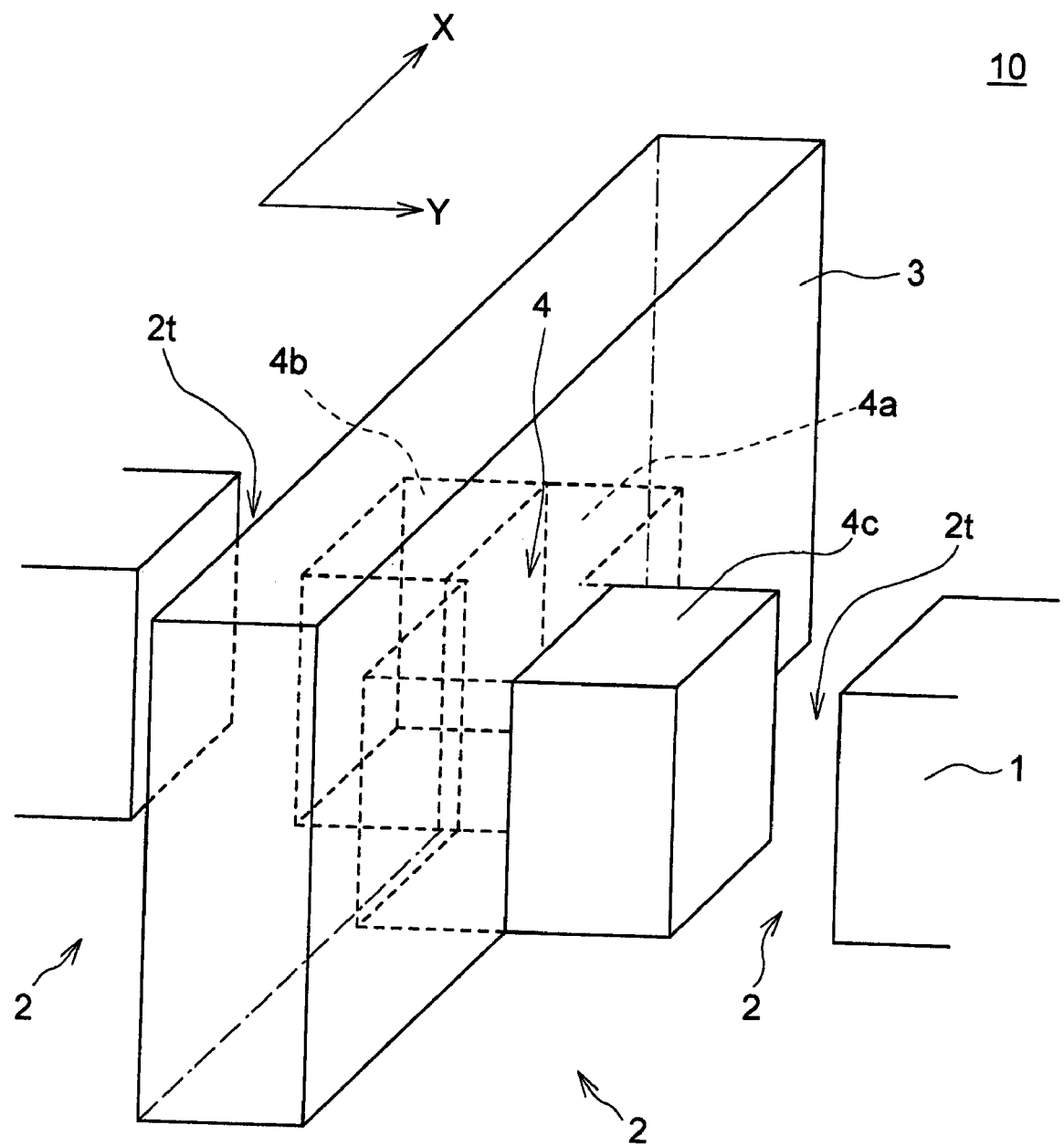
FIG. 1 is a general perspective view for explaining an outline of a semiconductor device according to an embodiment of the present invention.

With reference to the general perspective view of FIG. 1, an outline of a fin-FET 10 according to a preferred embodiment of the present invention is described.

As shown in FIG. 1, an element isolation insulating film 2 is buried in a trench 2t formed in a semiconductor substrate 1 by a height halfway along a depth of the trench 2t. An active region 4 is thereby formed to be surrounded by the trench 2t and to protrude from an upper surface of the element isolation insulating film 2. As shown in FIG. 1, the active region 4 is crank-shaped and includes a central portion 4a, a portion 4b extending from one end of the central portion 4a in a Y direction, and a portion 4c extending from the other end of the central portion 4a in the Y direction. An upper surface and side surfaces of each of the central portion 4a, a part of the portion 4b, and a part of the portion 4c are covered with a gate electrode 3.

Although not shown in FIG. 1, a source region and a drain region are formed in parts of the both side portions 4b and 4c of the active region 4, which parts are not covered with the gate electrode 3, respectively, by performing ion implantation with the gate electrode 3 used as a mask. At the time of ion implantation, impurities used in the ion implantation are also diffused into parts of the portions 4b and 4c which parts (parts mentioned above) are covered with the gate electrode 4 (implantation lowering).

However, in the fin-FET 10 according to the embodiment, the both side portions 4b and 4c of the active region 4 are connected to the central portion 4a thereof formed in an X direction in which the gate electrode 3 extends at positions offset to each other in the X direction, respectively. Due to this, the source region and the drain region formed in the respective portions 4b and 4c can be distanced from each other, thereby making it possible to suppress the short channel effect. Namely, an effective channel length of the fin-FET 10 is a sum of a width of the gate electrode 3 and an offset width between the portions 4b and 4c in the X direction. Therefore, by increasing this offset width, the short channel effect can be sufficiently suppressed accordingly.

With reference to FIGS. 2A to 13B, a method of manufacturing a fin-FET according to the embodiment is described next in detail. FIG. 2B is a cross-sectional view taken along a line A-A of FIG. 2A. The same shall apply to FIGS. 3A and 3B to 12A to 12B.

Figure 2A:
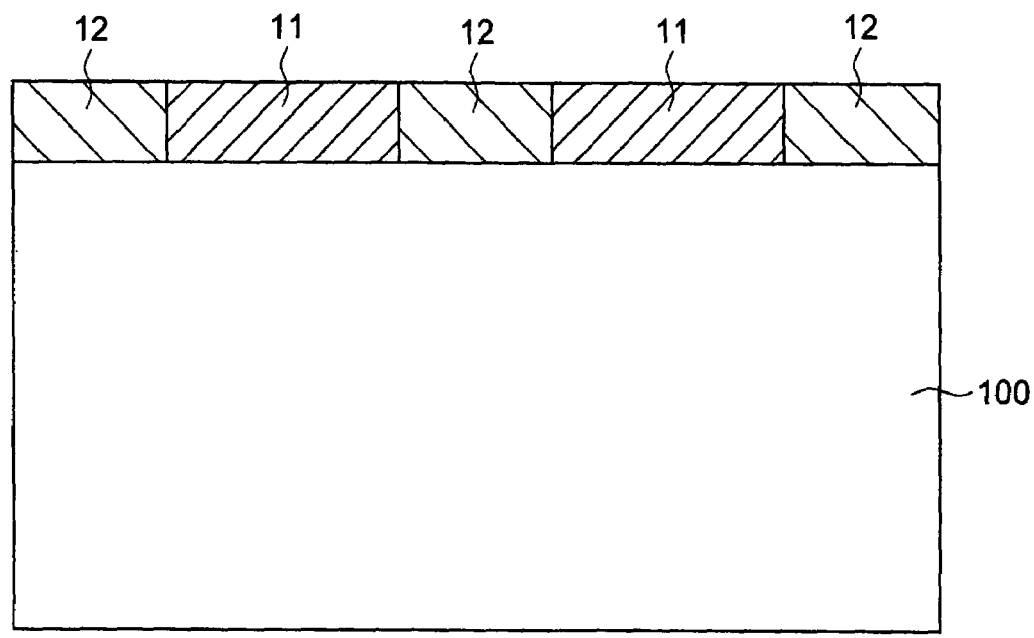
FIG. 2 is a cross-sectional view and a plane view showing a step (formation of a silicon nitride film 11 and a silicon oxide film 12) in a method of manufacturing the semiconductor device according to the embodiment of the present invention.
Figure 2B:
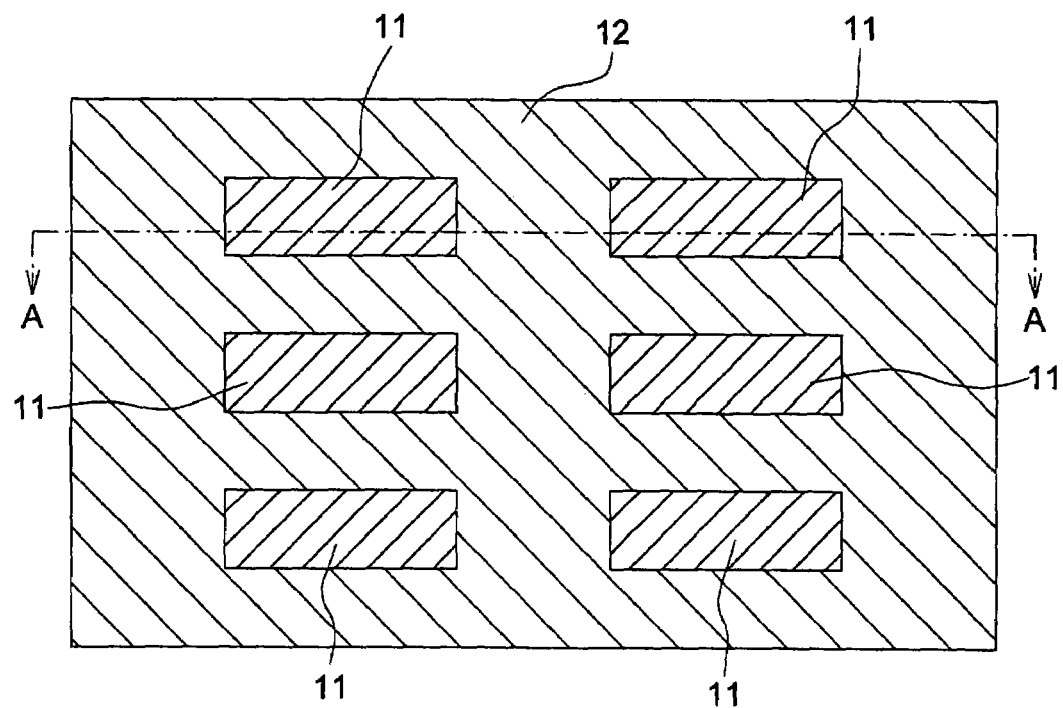

As shown in FIGS. 2A and 2B, a silicon nitride film 11 is formed on a semiconductor substrate 100. The silicon nitride film 11 is patterned with a photomask (not shown) used as a mask, thereby leaving the silicon nitride film 11 in the form of a plurality of lands as shown in FIG. 1B.

Next, a silicon oxide film 12 is formed on an entire surface of the semiconductor substrate 100 including portions among and around the lands of the silicon nitride film 11. Then using the silicon nitride film 11 as a stopper, the silicon oxide film 12 is polished by CMP (Chemical Mechanical Polishing). As a result, the silicon nitride film 11 and the silicon oxide film 12 are flattened so that an upper surface of the silicon nitride film 11 is almost flush with that of the silicon oxide film 12.

Figure 3A:
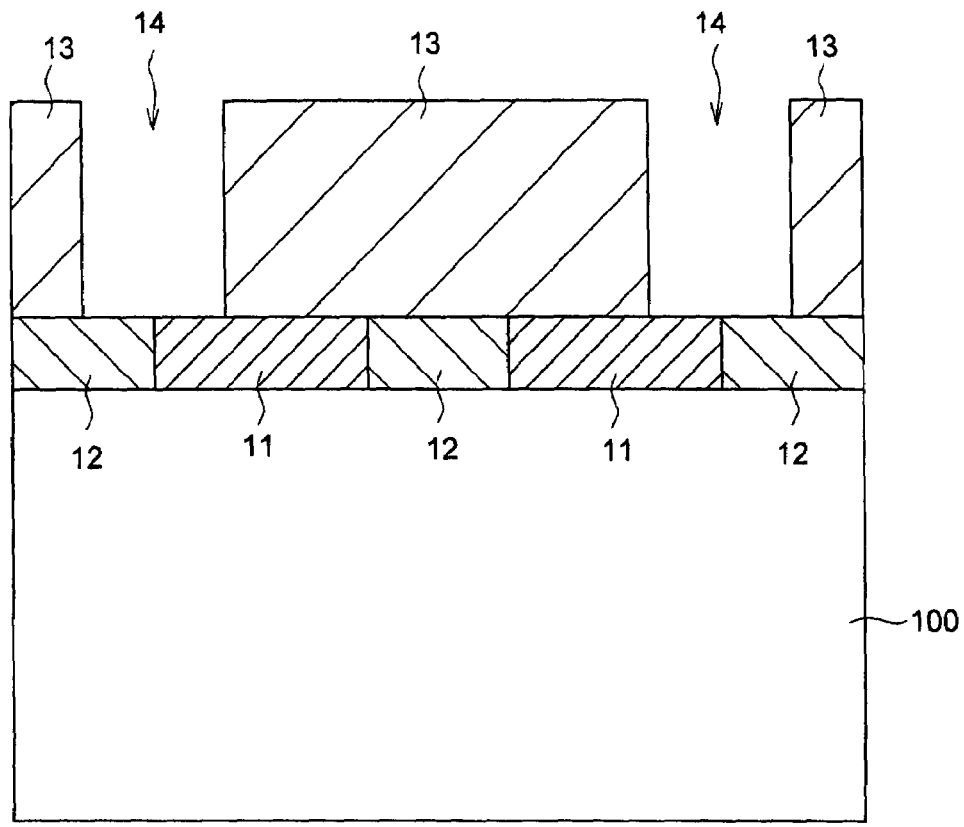
FIG. 3 is a cross-sectional view and a plane view showing a step (formation of a photoresist 13) in the method of manufacturing the semiconductor device according to the embodiment of the present invention.
Figure 3B:
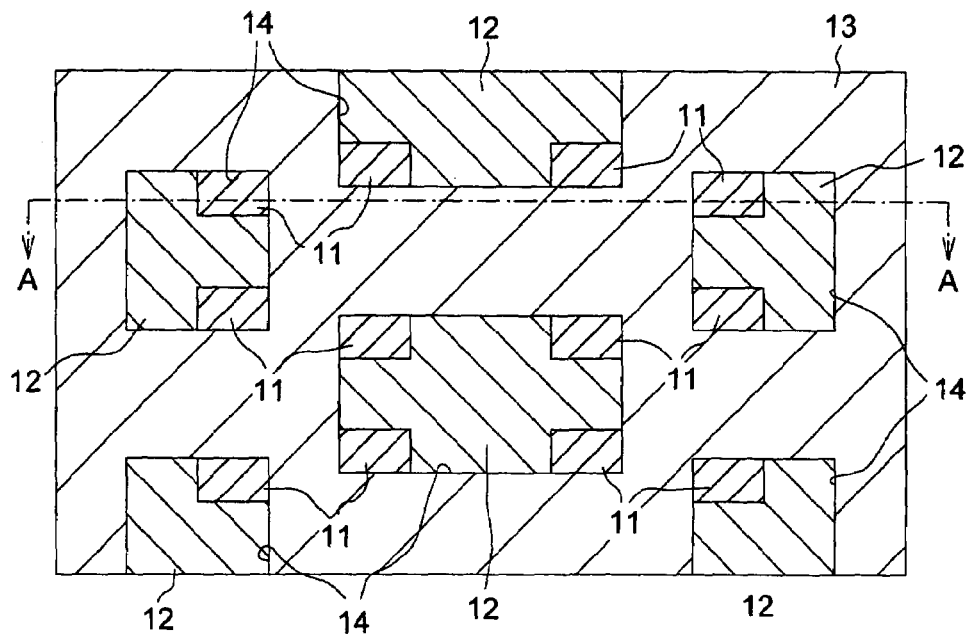

As shown in FIGS. 3A and 3B, a photoresist 13 including a plurality of openings 14 is formed. As shown in FIG. 3B, each of the openings 14 is formed to partially expose the silicon nitride film 11 and the silicon oxide film 12.

Figure 4A:
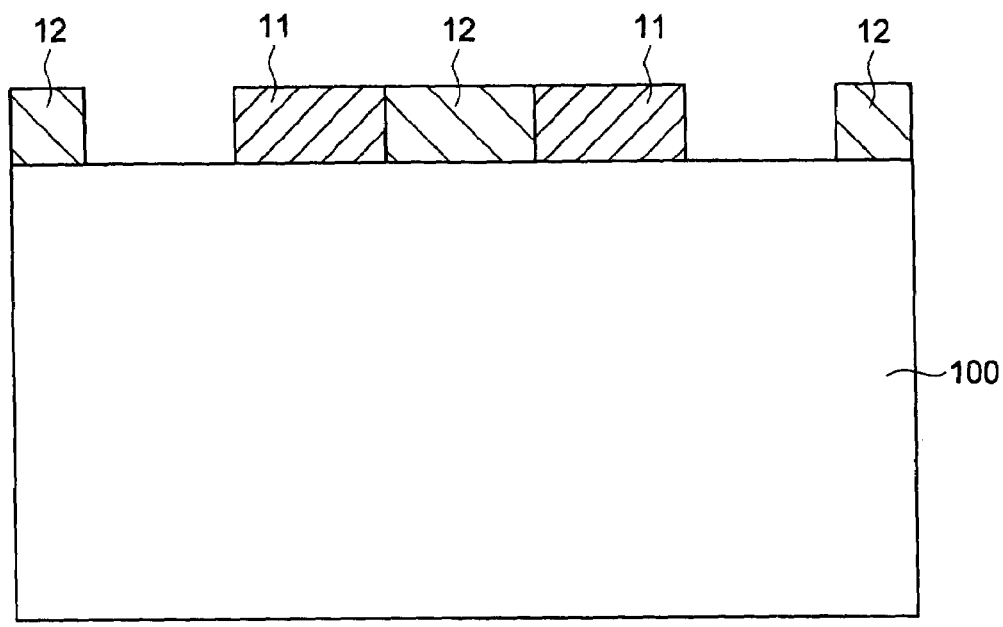
FIG. 4 is a cross-sectional view and a plane view showing a step (patterning of the silicon nitride film 11 and the silicon oxide film 12) in the method of manufacturing the semiconductor device according to the embodiment of the present invention.
Figure 4B:
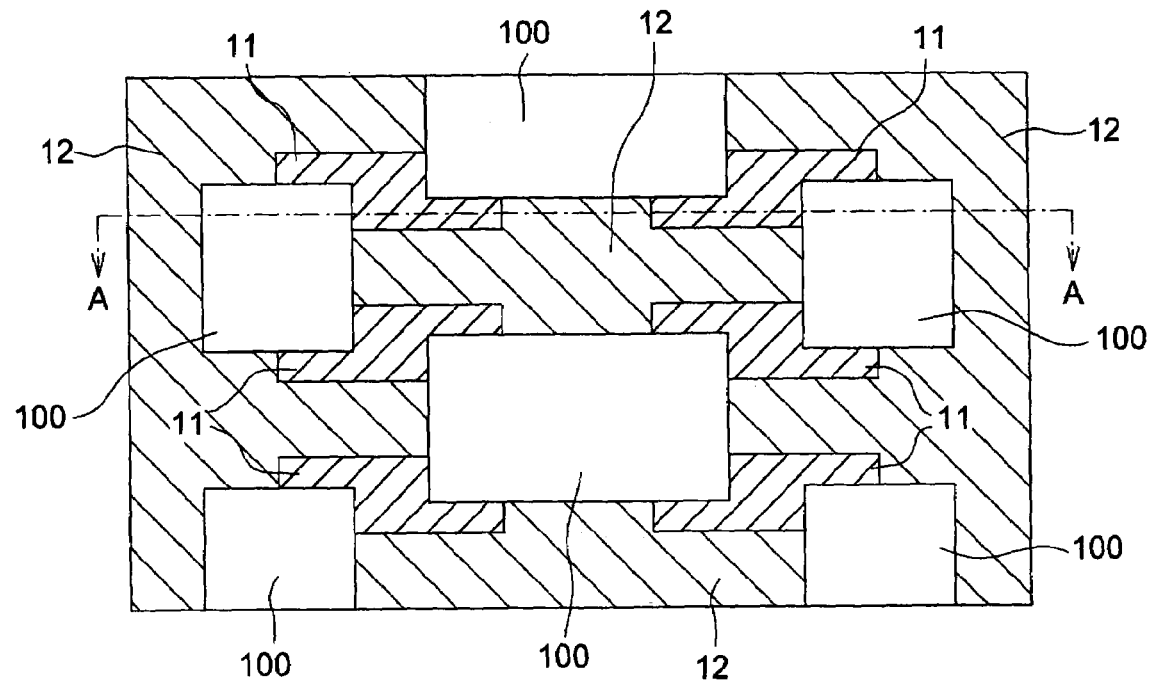

Using the photoresist 13 as a mask, the silicon nitride film 11 and the silicon oxide film 12 are dry etched. As a result, as shown in FIGS. 4A and 4B, the patterned silicon nitride film 11 and the patterned silicon oxide film 12 are left on the semiconductor substrate 100.

Figure 5A:
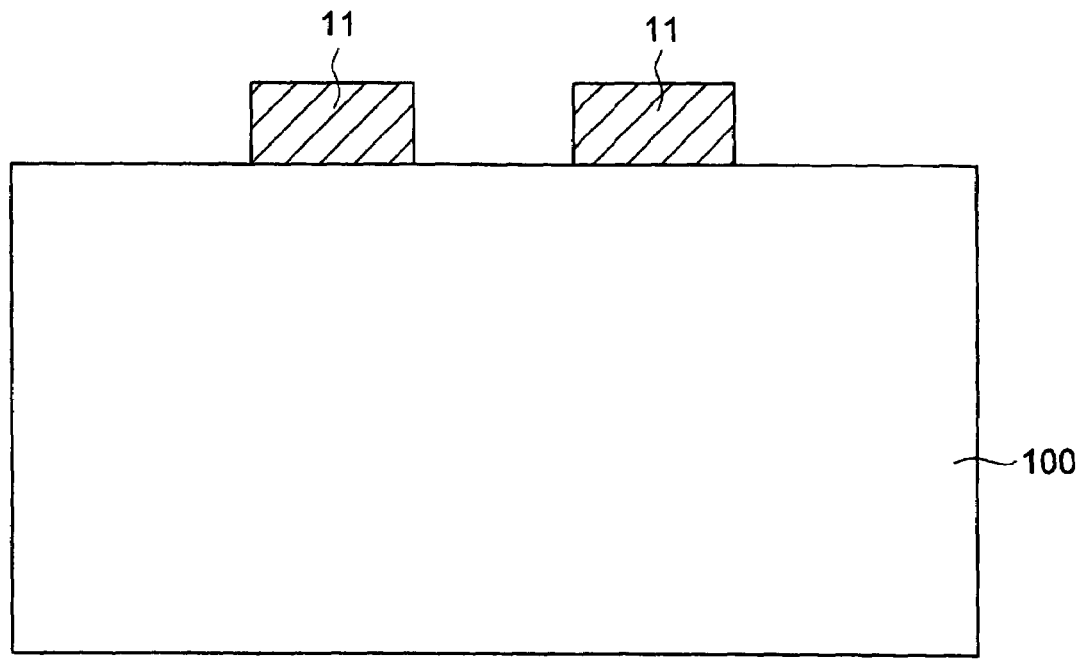
FIG. 5 is a cross-sectional view and a plane view showing a step (removal of the silicon oxide film 12) in the method of manufacturing the semiconductor device according to the embodiment of the present invention.
Figure 5B:
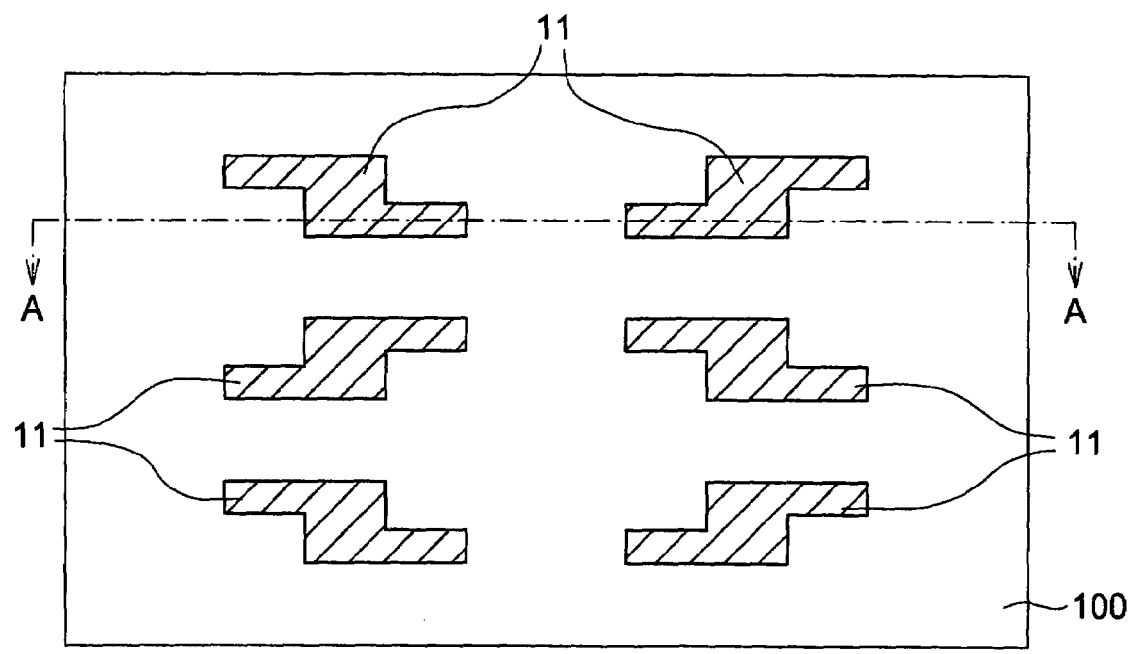

The silicon oxide film 12 is entirely removed by wet etching. As a result, as shown in FIG. 5A, only a plurality of land patterns each made of the silicon nitride film 11 is left on the semiconductor substrate 100. As shown in FIG. 5B, each of the land patterns is crank-shaped in a plane view.

Figure 6A:
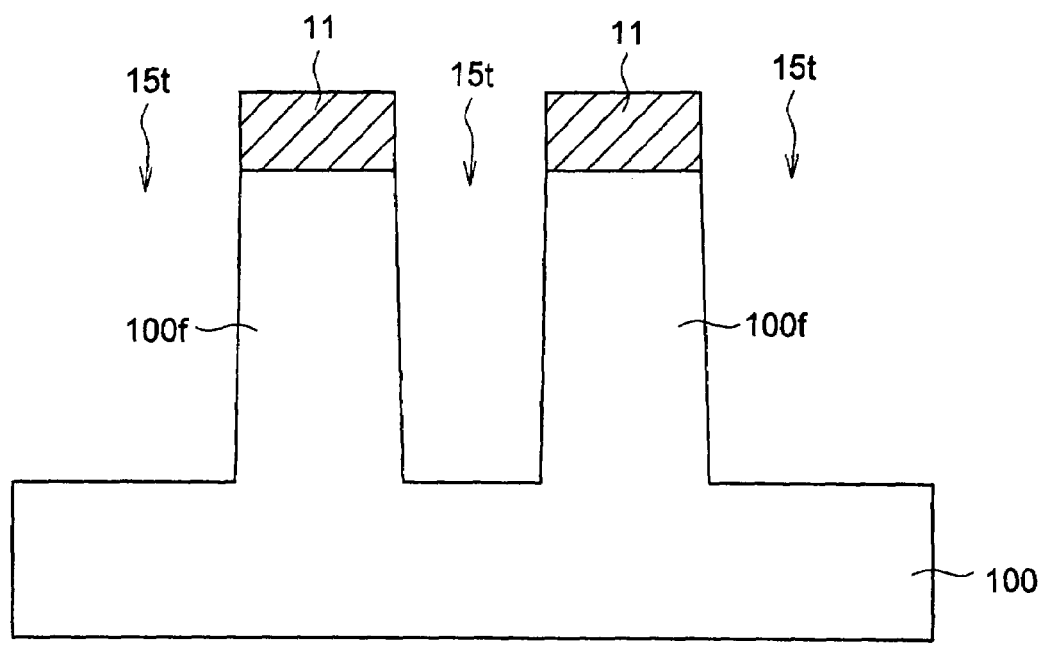
FIG. 6 is a cross-sectional view and a plane view showing a step (formation of a trench 15t) in the method of manufacturing the semiconductor device according to the embodiment of the present invention.
Figure 6B:
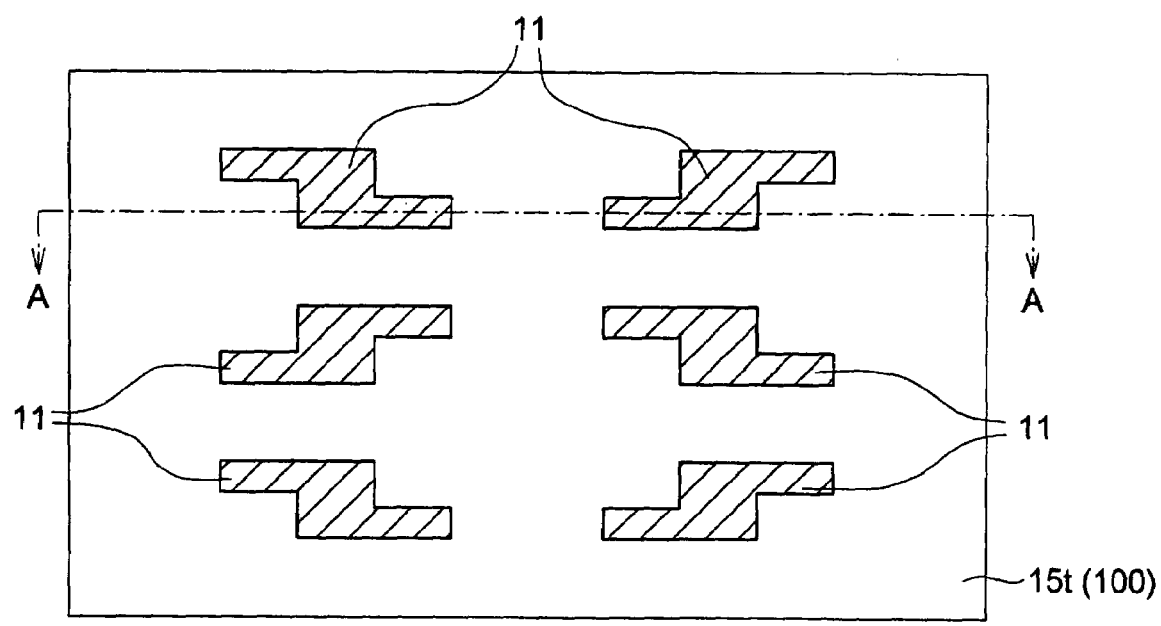

Using the crank-shaped silicon nitride film 11 as a mask, the semiconductor substrate 100 is dry etched. As a result, as shown in FIG. 6A, a plurality of fin-shaped parts 100f each defined by trenche 15t are formed.

Next, a silicon oxide film is formed on an entire surface of the semiconductor substrate 100 including interior of the trench 15t as an element isolation insulating film. After performing the CMP with the silicon nitride film 11 as a stopper, the element isolation insulating film is wet etched so that a height of the element isolation insulating film is, for example, about 100 nanometers (nm) from the surface of the semiconductor substrate 100. Thereafter, the silicon nitride film 11 is removed.

Figure 7A:
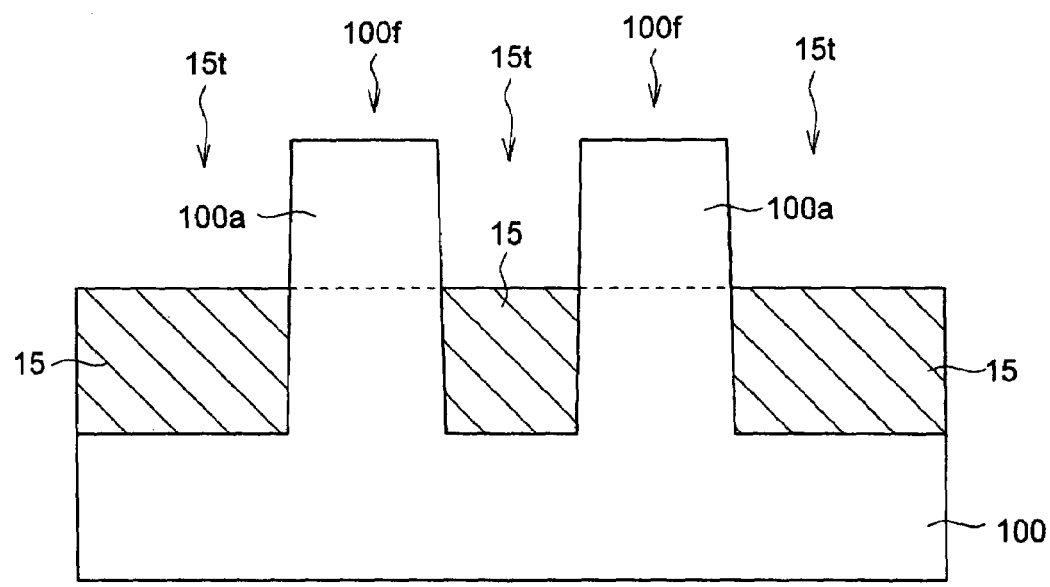
FIG. 7 is a cross-sectional view and a plane view showing a step (formation of an element isolation insulating film 15) in the method of manufacturing the semiconductor device according to the embodiment of the present invention.
Figure 7B:
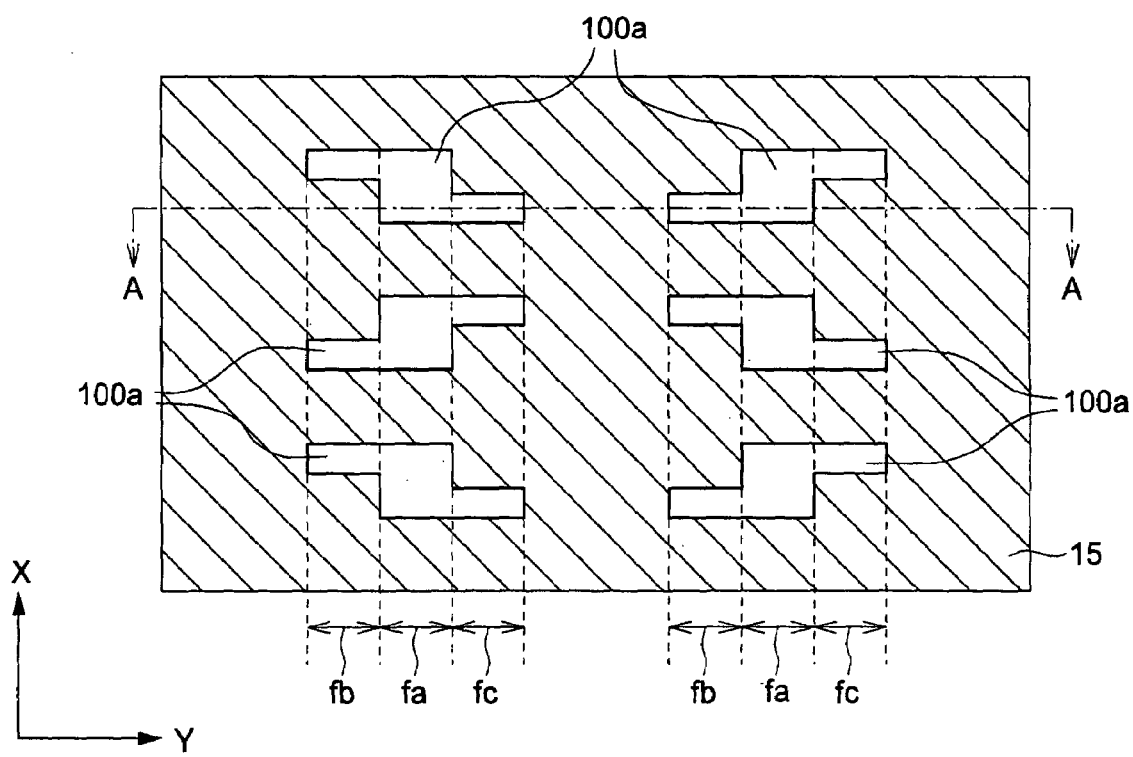

As a result, as shown in FIGS. 7A and 7B, an element isolation insulating film 15 is formed in trench 15t by a predetermined height. Upper portions of the fin-shaped parts 100f protrude from an upper surface of the element isolation insulating film 15. These upper portions serve as active regions 100a, respectively. A pattern of the patterned silicon nitride film 11 (see FIG. 6B) is transferred onto each of the active regions 100a. Due to this, as shown in FIG. 7B, each of the active regions 100a is crank-shaped in a plane view. In this manner, the fin-shaped active regions 100a surrounded by the element isolation insulating film 15 and crank-shaped in a plane view are formed.

As shown in FIG. 7B, each of the active regions 10a includes a central portion fa, a portion fb extending from one end of the central portion fa in the Y direction, and a portion fc extending from the other end thereof in the Y direction. The portions fb and fc are arranged to be offset each other in the X direction.

Figure 8A:
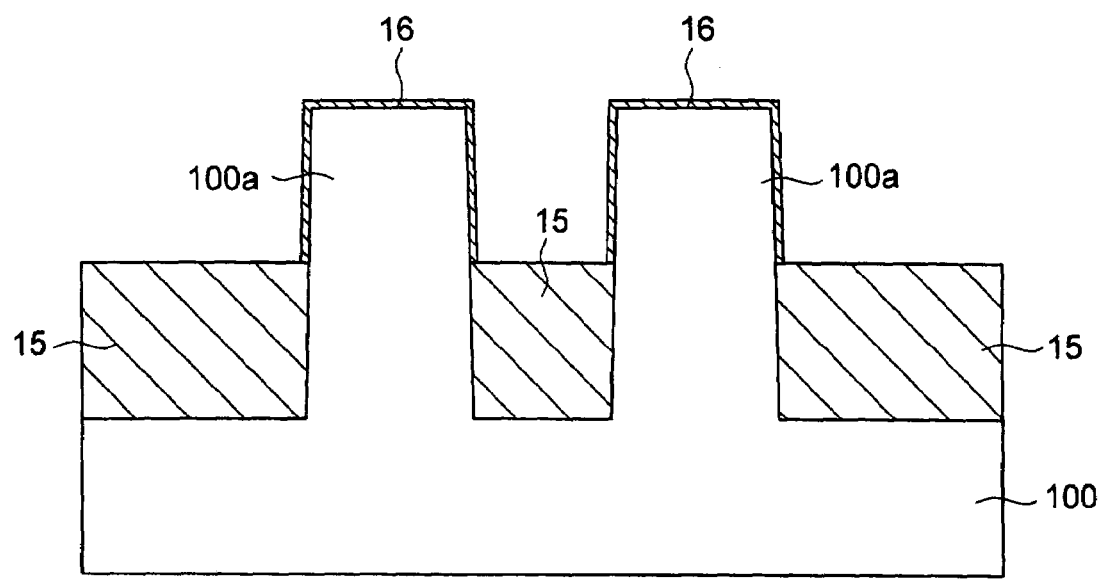
FIG. 8 is a cross-sectional view and a plane view showing a step (formation of a gate insulating film 16) in the method of manufacturing the semiconductor device according to the embodiment of the present invention.
Figure 8B:
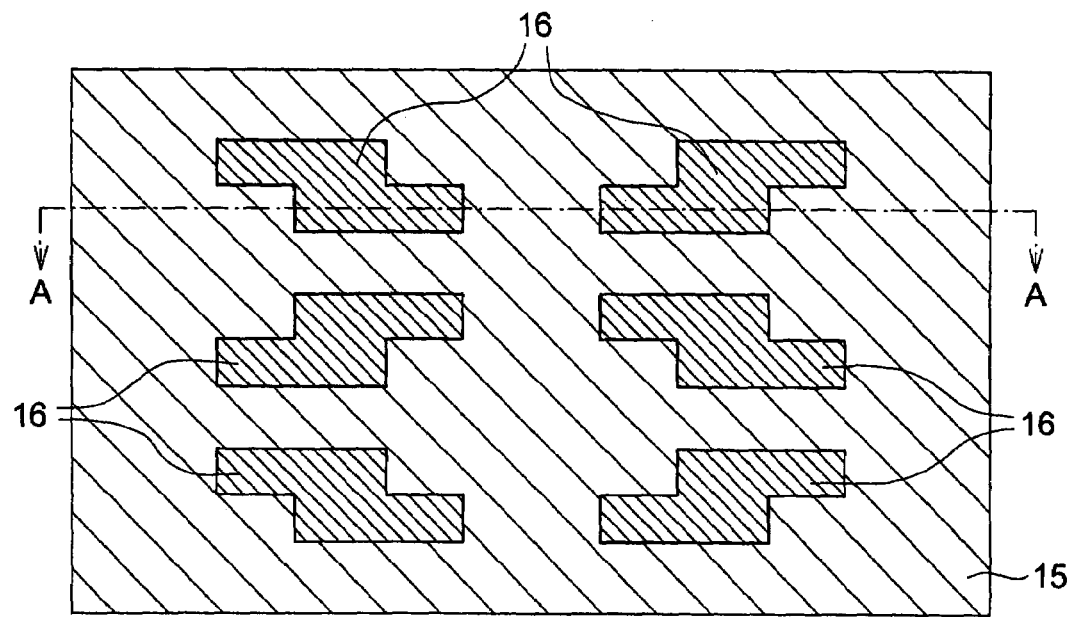

As shown in FIGS. 8A and 8B, a gate insulating film 16 is formed on a surface of each of the active regions 100a by performing thermal oxidation.

Figure 9A:
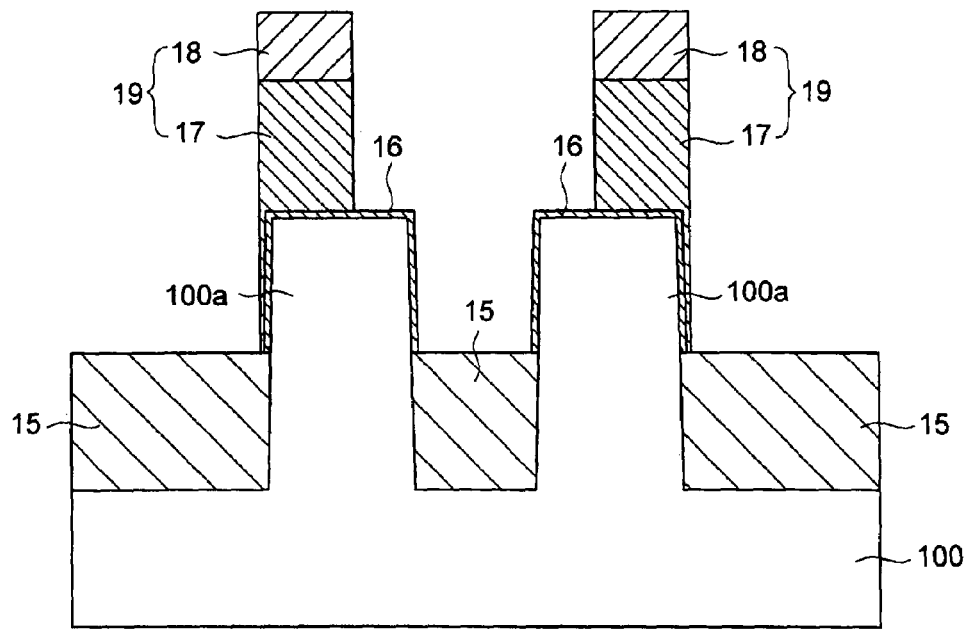
FIG. 9 is a cross-sectional view and a plane view showing a step (formation of a gate electrode 17 and a cap insulating film 18 (gates 19)) in the method of manufacturing the semiconductor device according to the embodiment of the present invention.

Next, a gate electrode film and a silicon nitride film are formed on the entire surface of the semiconductor substrate 100, and the gate electrode film and the silicon nitride film are patterned using a photoresist (not shown) having a gate electrode shape. As a result, as shown in FIG. 9A, gates 19 each including a gate electrode 17 and a cap insulating film 18 are formed.

Figure 9B:
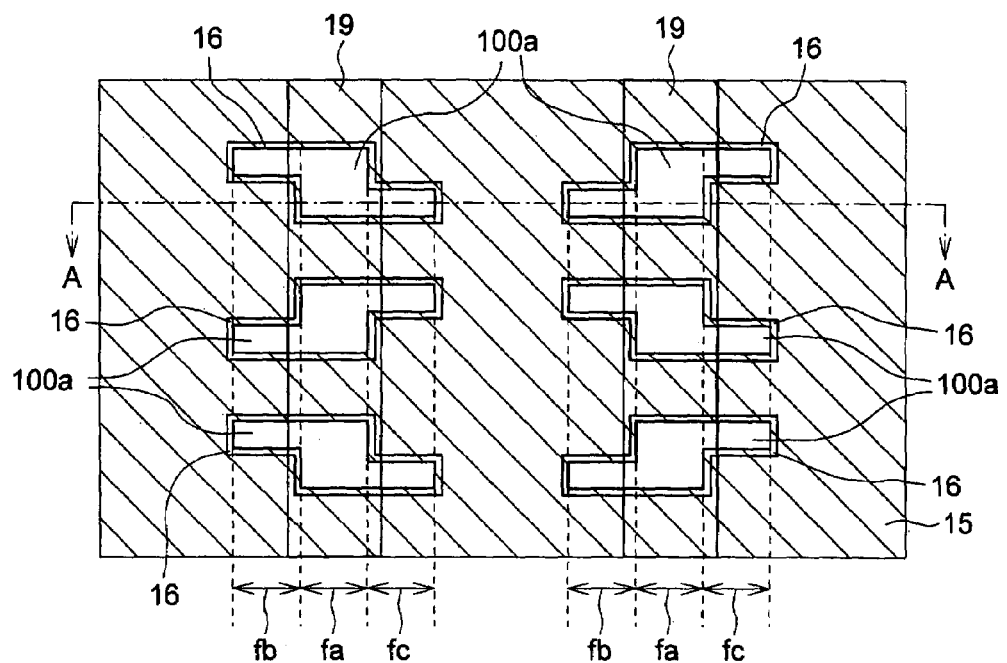

As shown in FIG. 9B, each of the gates 19 is formed so as to cover the central portion fa of each of the crank-shaped active regions 100a covered with the gate insulating film 16 and to cover parts of the portions fb and fc on the respective both sides of the central portion fa (which parts are connected to the central portion fa).

In FIG. 9B, each of the gates 19 (the cap insulating film 18 and the gate electrode 17) and the gate insulating film 16 are not hatched so as to show states of the active regions 100a present under the respective gates 19.

As indicated by arrows in FIG. 1A, ion implantation is performed on the entire surface while using the gates 19 as a mask, thereby forming source and drain regions 20. At this time, the ion implantation is performed with high energy so as to implant impurity ions deeply. As a result, the source and drain regions 20 are formed to be diffused even into regions under the gates 19 serving as the mask (implantation lowering).

Figure 10A:
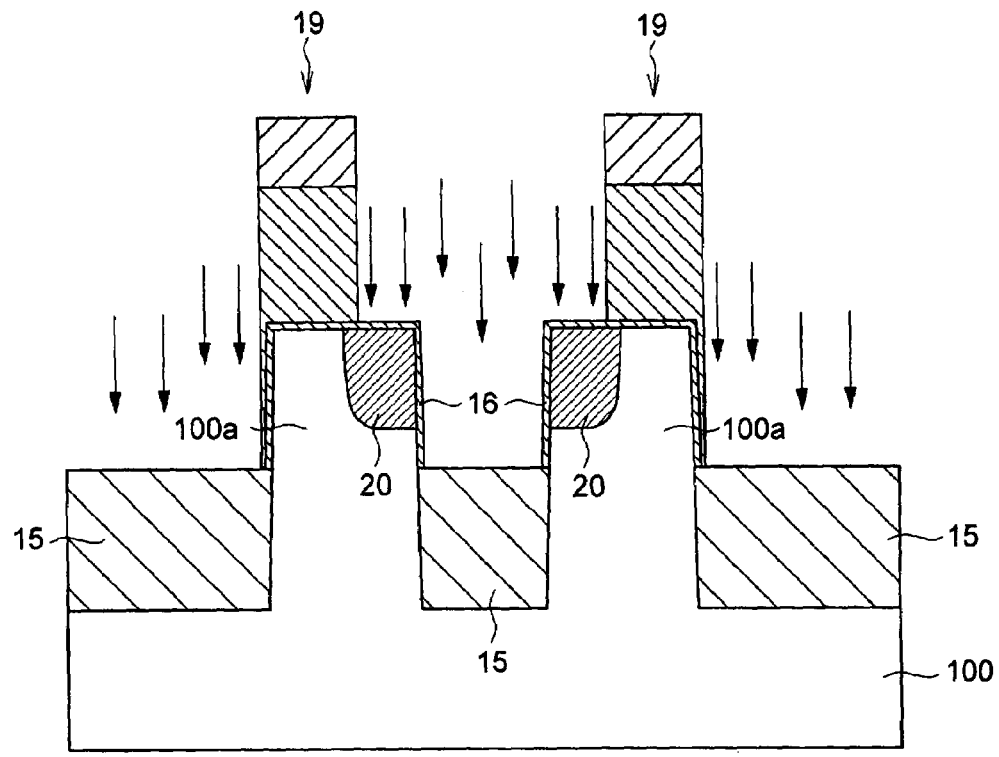
FIG. 10 is a cross-sectional view and a plane view showing a step (formation of source and drain regions 20) in the method of manufacturing the semiconductor device according to the embodiment of the present invention.
Figure 10B:
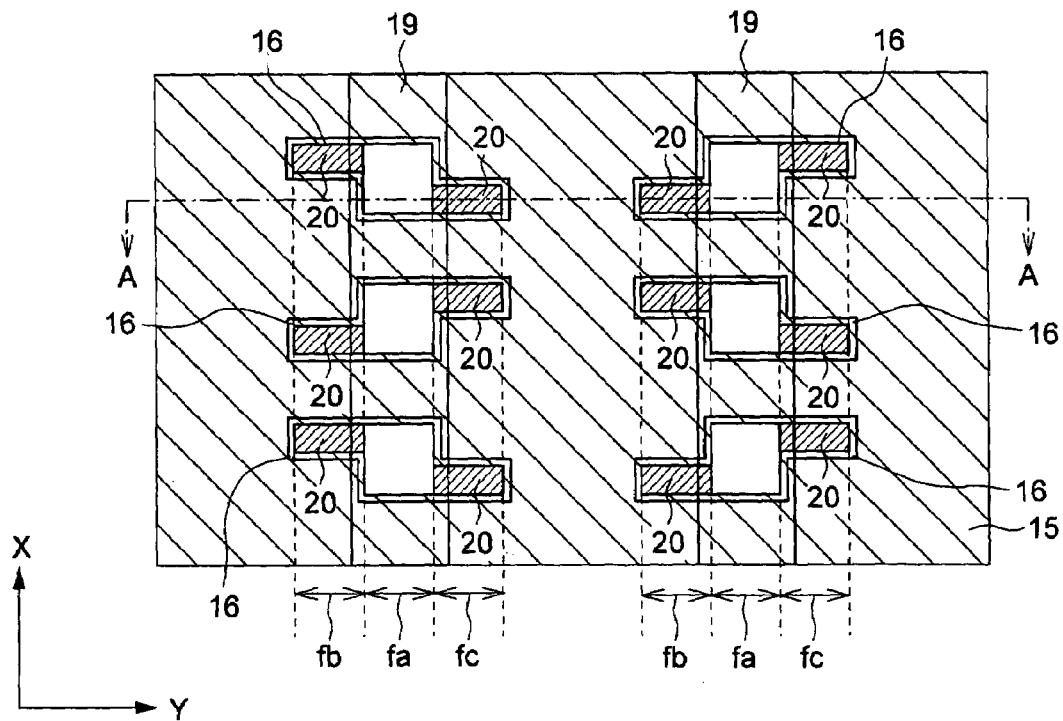

As shown in FIG. 10B, the source/drain regions 20 formed on both sides of each of the gates 19 are diffused into the region under each gate 19 in each of the active regions 100a. Nevertheless, because of the crank-shaped active regions 100a, the source region 20 and the drain region 20 formed to put the central portion fa of each of the active regions 100a between the source region 20 and the drain region 20 are located offset each other in the X direction in which the gates 19 extend. Namely, the portions fb and fc on the both sides of each active region 100a that portions serve as the source/drain regions 20 are arranged on +X side and -X side in the X direction in which the gates 19 extend, respectively. Due to this, even if the two source/drain regions 20 formed on the both sides of the central portion fa are diffused toward the central portion fa, it is possible to prevent the source/drain regions 20 from being close to each other by the distance that makes the short channel effect conspicuous. In other words, an effective channel length of the fin-FET formed in the embodiment is about a sum of an offset width between the portions fb and fc on the both sides of each active region 100a and a width of each gate 19. By making this offset width large, it is possible to sufficiently suppress the short channel effect.

In FIG. 10B, similarly to FIG. 9B, each of the gates 19 (the cap insulating film 18 and the gate electrode 17) and the gate insulating film 16 are not hatched so as to show states of the active regions 100a present under the respective gates 19.

Figure 11A:
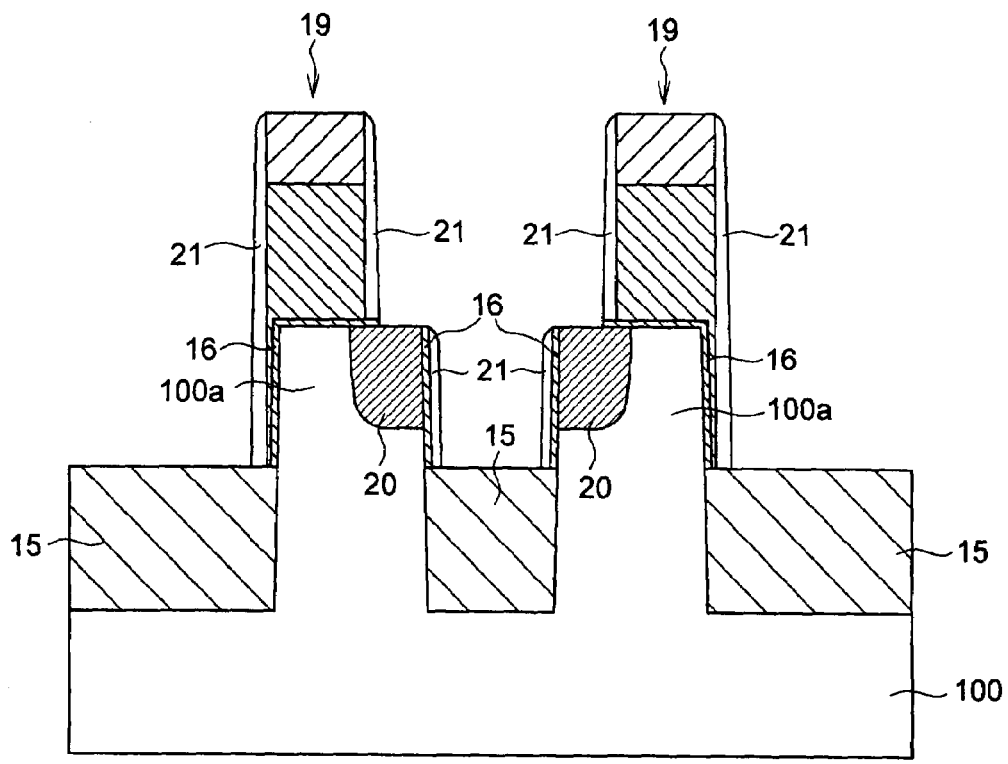
FIG. 11 is a cross-sectional view and a plane view showing a step (removal of the gate insulating film 16 on the source and drain regions 20) in the method of manufacturing the semiconductor device according to the embodiment of the present invention.
Figure 11B:
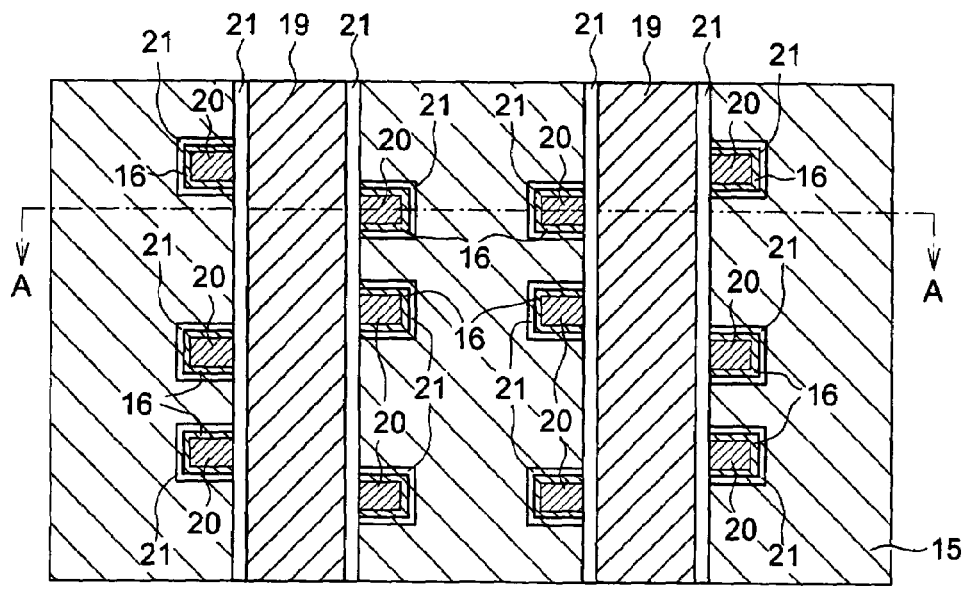

As shown in FIGS. 11A and 11B, sidewall insulating films 21 are formed on side surfaces of each of the gates 19, respectively. The sidewall insulating films 21 are formed by forming an insulating film for sidewalls on the entire surface of the semiconductor substrate 100 and dry etching (anisotropically etching) the insulating film for sidewalls. Therefore, as shown in FIGS. 11A and 11B, the sidewall insulating films 21 are also formed on sidewalls of portions, which are not covered with the gates 19 (in which portions the source and drain regions 20 are formed), of the active regions 100a.

Subsequently, portions, which are not covered with the gates 19, of the gate insulating film 16 on the source/drain regions 20 are selectively removed, thereby exposing surfaces of the source/drain regions 20 as shown in FIGS. 11A and 11B.

Figure 12A:
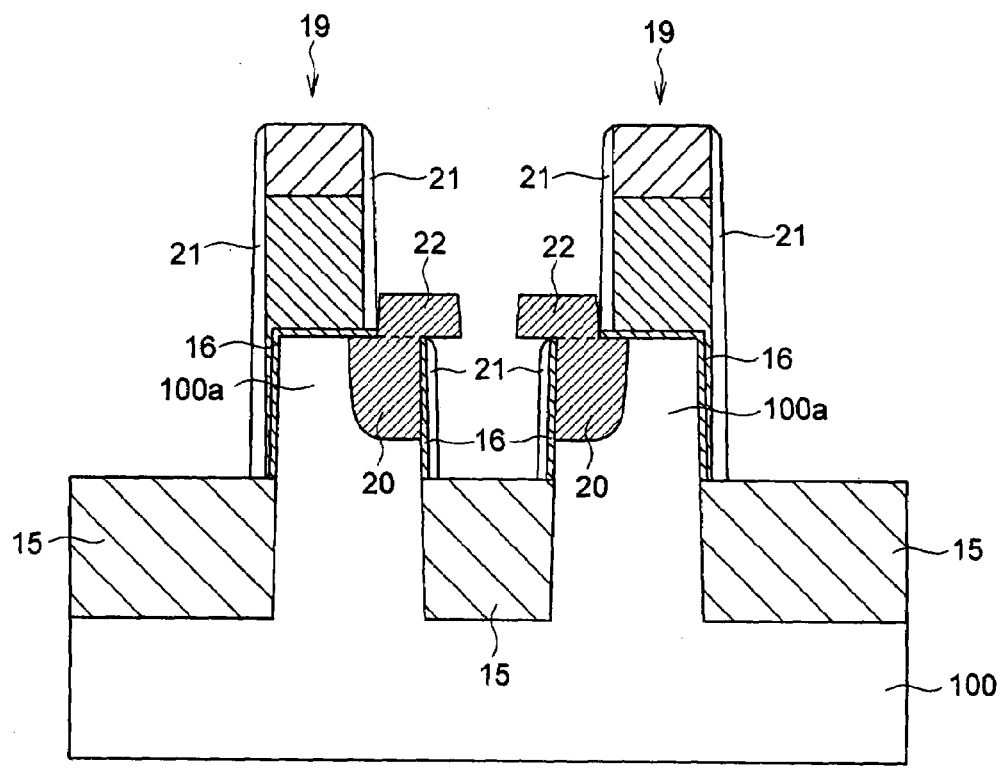
FIG. 12 is a cross-sectional view and a plane view showing a step (formation of silicon epitaxial layers 22) in the method of manufacturing the semiconductor device according to the embodiment of the present invention.
Figure 12B:
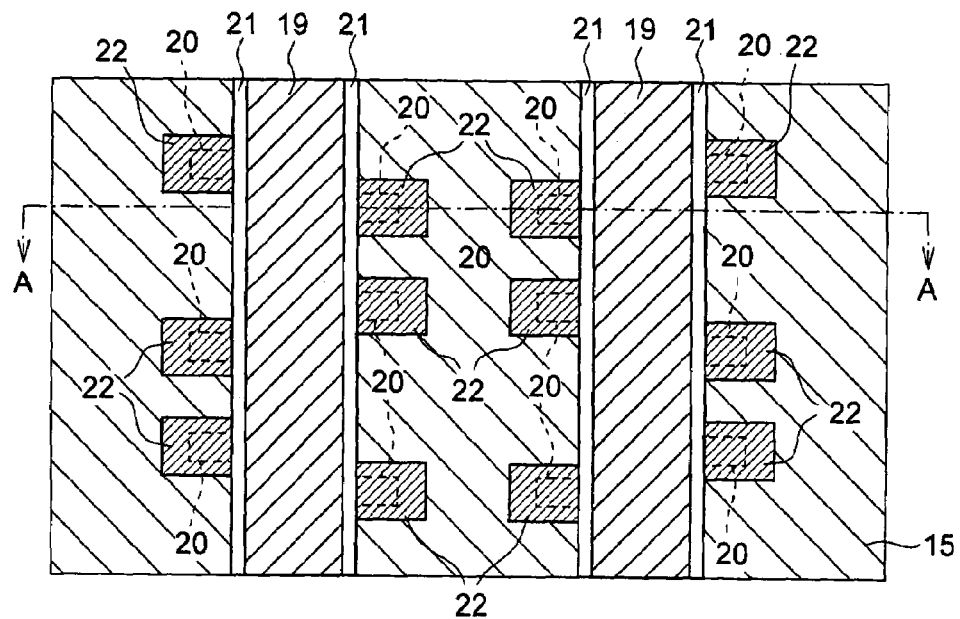

Silicon selective epitaxial growth is then performed. In the silicon selective epitaxial growth, silicon is grown only in portions in which silicon is exposed. Due to this, as shown in FIGS. 12A and 12B, silicon epitaxial layers 22 are grown on the exposed portions of the source/drain regions 20 that are a part of the semiconductor substrate 100. The silicon epitaxial layers 22 are doped with impurities contained in the source/drain regions 20 during the epitaxial growth. Due to this, the silicon epitaxial layers 22 become conductive layers containing the same impurities as those contained in the source/drain regions 20.

As shown in FIG. 12B, the silicon epitaxial layers 22 are formed to be wider than the source/drain regions 20 and to run off edges of the active regions 100a.

Figure 13A:
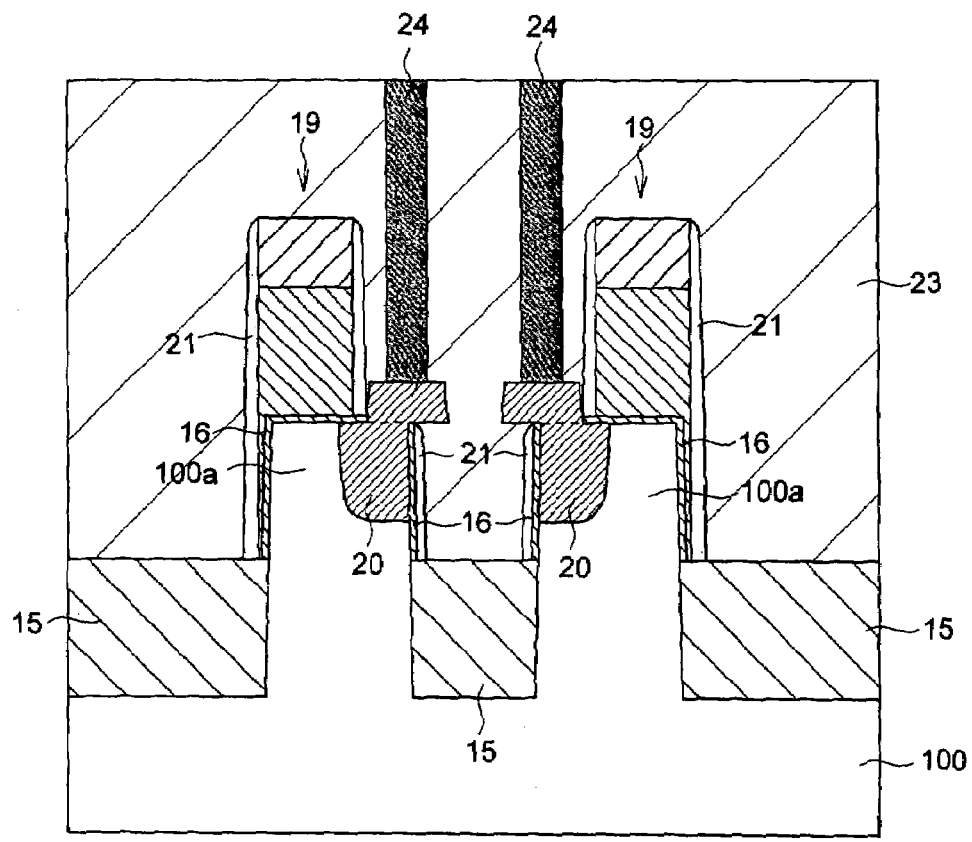
FIG. 13 is a cross-sectional view and a plane view showing a step (formation of an interlayer insulating film 23 and contact plugs 24) in the method of manufacturing the semiconductor device according to the embodiment of the present invention.
Figure 13B:
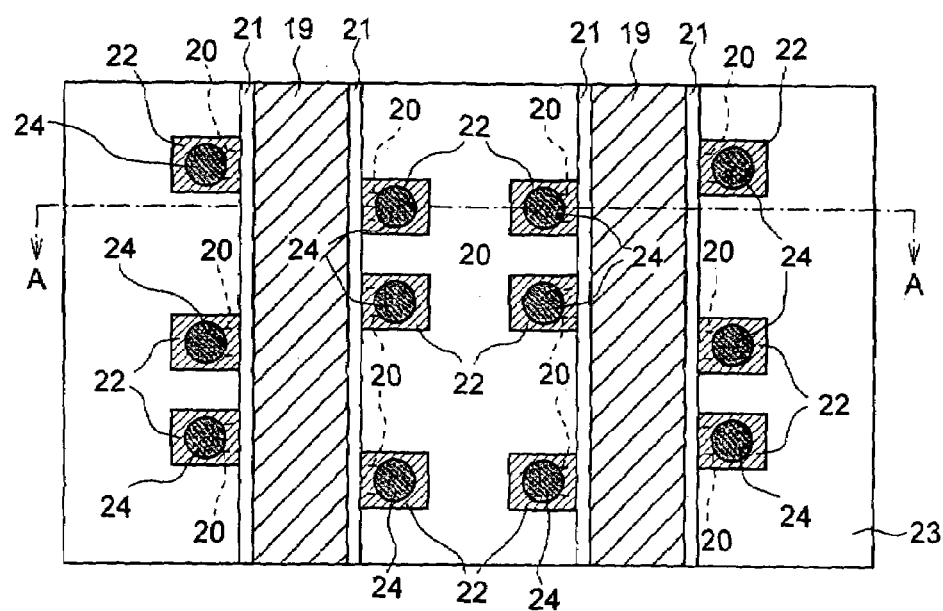
Figure 14A:
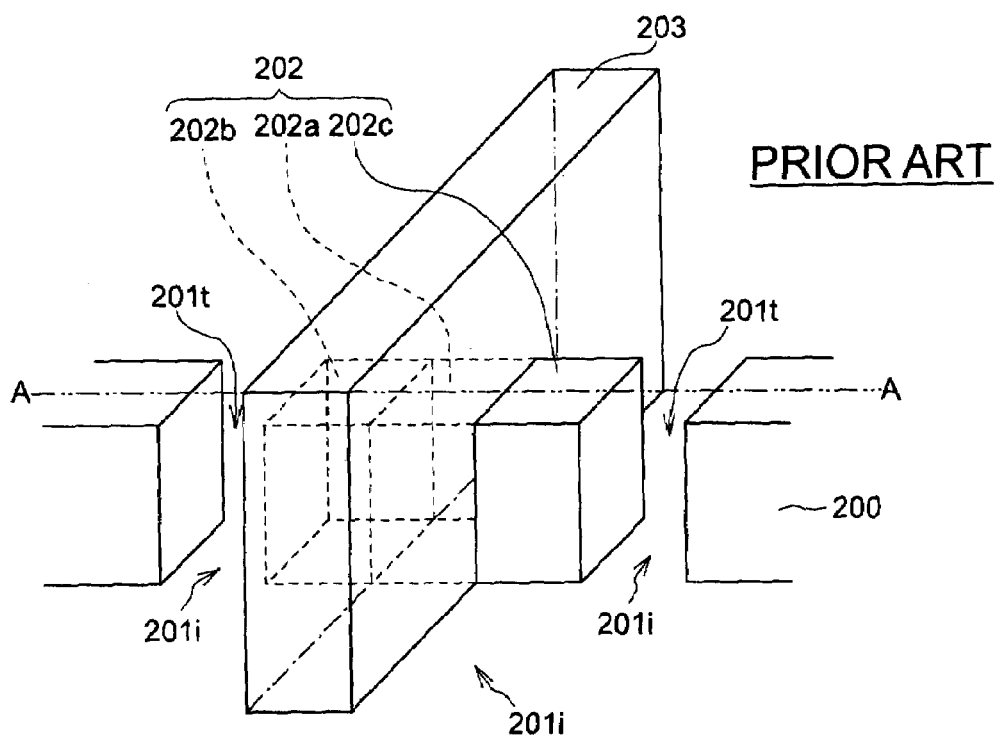
FIG. 14A is a general perspective view showing a structure of a conventional fin field effect transistor.
Figure 14B:
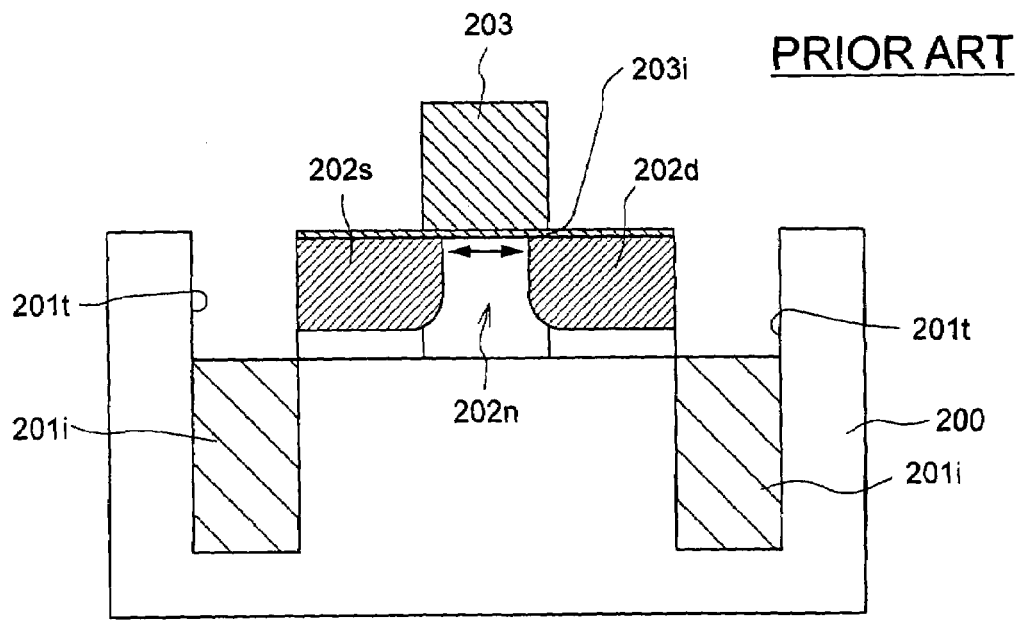
FIG. 14B is a general cross-sectional view taken along a line A-A of FIG. 14A.

As shown in FIGS. 13A and 13B, an interlayer insulating film 23 is formed on the entire surface of the semiconductor substrate 100, and contact plugs 24 connected to the respective silicon epitaxial layers 22 are then formed. At this time, since the silicon epitaxial layers 22 are formed wide as stated above, it is possible to secure large positioning margins for the contact plugs 24.

Although subsequent steps are not shown in the drawings, necessary interconnects and the like are formed. As a consequence, a fin-FET is completed.

As explained above, according to the embodiment of the present invention, each of the active regions 100a has a fin structure and each of the gates 19 (gate electrode 17) covers the upper and side surfaces of each active region 10a. Due to this, not only the upper surface but also the side surfaces of each active region 100a become a channel region, thereby making it possible to ensure a large amount of current. Besides, the portions, which are covered with the gates 19, of the active regions 100a include bent portions (a part of each of the portions fb and fc covered with the gates 19). Due to this, even if the source/drain regions 20 formed on the both sides of each active region 100a are diffused toward the central portion fa of the active region 100a, it is possible to keep the distance between the source/drain regions 20 sufficiently wide. Therefore, even if the gate length is smaller, the short channel effect can be sufficiently suppressed.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, the case where the active regions of the fin-FET are crank-shaped in a plane view has been described in the embodiment. However, the plane shape of each active region may be a shape other than the crank shape as long as the shape can suppress the short channel effect.

What is claimed is:

1. A semiconductor device comprising:
    an active region defined to have a crank shape by an STI region formed on a semiconductor substrate, the active region having an upper surface higher than an upper surface of the STI region, and the active region comprising a central portion and a pair of side portions which are offset and extend from opposing sides of the central portion;
    a source region and a drain region formed on the pair of side portions of the active region, respectively;
    a channel region formed between the source region and the drain region in the active region; and
    a gate electrode covering an upper surface and a surface of the opposing sides of the central portion of the active region including the channel region.

2. The semiconductor device as claimed in claim 1, wherein the source region and the drain region are arranged symmetrically with respect to a central point of the active region.

3. A semiconductor device comprising:
    a fin-shaped active region formed by a part of a semiconductor substrate, the active region comprising a central portion and a pair of side portions which are offset and extend from opposing sides of the central portion; and
    a gate electrode extending in an X direction to cross the active region, and covering an upper surface and a surface of the opposing sides of the central portion of the active region,
    wherein the active region has a channel region covered by the gate electrode and a source region and a drain region formed on both ends of the active region, respectively,
    wherein the source region and the drain region are offset from each other in the X direction.

4. The semiconductor device as claimed in claim 3, wherein a part of the source region and a part of the drain region are covered with the gate electrode.

5. A semiconductor device comprising:
    a fin-shaped active region comprising a first portion and second and third portions which are offset and extend from opposing sides of the first portion;
    a gate electrode covering a surface of the opposing sides of the first portion of the active region; and
    a source region and a drain region provided on the second portion and the third portion opposed to each other across the first portion of the active region, respectively,
    wherein the first portion includes at least one bent portion.

6. The semiconductor device as claimed in claim 5, wherein the at least one bent portion includes a first bent portion and a second bent portion, and a region between the first bent portion and the second bent portion in the active region extends in a direction substantially identical to an extension direction of the gate electrode.

7. A semiconductor device comprising:
    a fin-shaped active region including:
        a first portion extending in a first direction;
        a second portion connected to a first side of the first portion at an end of the first portion and extending in a second direction; and
        a third portion connected to a second side of the first portion which is opposite the first side at an other end of the first portion and being offset with the second portion and extending in the second direction;
    a gate electrode extending in the first direction and covering the first and second sides of the first portion, a part of the second portion, and a part of the third portion;
    a source region provided on another part of the second portion; and
    a drain region provided on another part of the third portion.

8. The semiconductor device as claimed in claim 1, wherein the gate electrode extends in a first direction and the pair of side portions extend from the opposing sides of the central portion in a second direction substantially perpendicular to the first direction, and wherein a part of the source region and a part of the drain region are covered with the gate electrode, the parts of the source and drain regions being offset in the first direction.

9. The semiconductor device as claimed in claim 1, wherein an effective channel length of the device comprises a sum of a width of the gate electrode and an offset width between the pair of side portions in the first direction.

10. The semiconductor device as claimed in claim 1, wherein the central portion comprises a bent portion, and the gate electrode is formed on the bent portion.

11. The semiconductor device as claimed in claim 1, further comprising:

a gate insulating film formed on the opposing sides of the central portion between the gate electrode, and the central portion.

12. The semiconductor device as claimed in claim 1, further comprising:

a silicon epitaxial layer formed on an upper surface of the source region and the drain region and having a width which is greater than a width of the pair of side portions such that the silicon epitaxial layer extends over an edge of the pair of side portions; and a contact plug formed on the silicon epitaxial layer.

\* \* \* \* \*